US005381068A

United States Patent [19]

Lorraine

[11] Patent Number: 5,381,068

[45] Date of Patent: Jan. 10, 1995

[54] ULTRASONIC TRANSDUCER WITH SELECTABLE CENTER FREQUENCY

[75] Inventor: Peter W. Lorraine, Schenectady, N.Y.

[73] Assignee: General Electric Company, Schenectady, N.Y.

[21] Appl. No.: 169,248

[22] Filed: Dec. 20, 1993

[51] Int. Cl.⁶ .............................................. H01L 41/08

[52] U.S. Cl. .................................... 310/358; 310/334; 310/337; 310/26

[58] Field of Search .................. 310/26, 311, 334–337, 310/357–359, 800, 321, 323, 328

[56] References Cited

U.S. PATENT DOCUMENTS

| | | | |
|---|---|---|---|
| 2,636,135 | 4/1953 | Peck, Jr. | 310/348 X |
| 2,682,623 | 6/1954 | Woodyard | 310/321 X |
| 2,837,668 | 6/1958 | Simpson | 310/26 |
| 3,365,680 | 1/1968 | Geil et al. | 310/321 |
| 3,509,387 | 4/1970 | Thorn et al. | 310/321 X |
| 4,217,684 | 8/1980 | Brisken et al. | 29/25.35 |
| 4,425,525 | 1/1984 | Smith et al. | 310/336 |
| 4,441,503 | 4/1984 | O'Donnell | 128/660 |
| 4,470,305 | 9/1984 | O'Donnell | 73/626 |
| 4,613,784 | 9/1986 | Haun et al. | 310/358 |
| 4,658,176 | 4/1987 | Nakaya et al. | 310/334 |
| 4,785,269 | 11/1988 | Adam et al. | 310/321 X |
| 4,924,503 | 5/1990 | Klein | 381/190 |
| 4,963,782 | 10/1990 | Bui et al. | 310/358 |
| 4,986,808 | 1/1991 | Broadwin et al. | 604/22 |
| 5,191,796 | 3/1993 | Kishi et al. | 310/358 X |

*Primary Examiner*—Mark O. Budd

*Attorney, Agent, or Firm*—Enrique J. Mora; Marvin Snyder

[57] ABSTRACT

An ultrasonic transducer with a selectable center frequency is provided. The transducer is made of a composite including a piezoelectric base and a plurality of elongated rods made of a material having a coefficient of elasticity substantially responsive to a control signal applied thereto. In one embodiment the rod material is a suitable magnetostrictive alloy in which case the control signal is a magnetic field. In another embodiment, the rod material is a suitable shape memory alloy in which case the control signal is a thermal signal. In either case, the level of the respective control signal, i.e., the level of the magnetic field or the temperature level, allows for selectively shifting the center frequency of the ultrasound beam produced by the transducer.

17 Claims, 2 Drawing Sheets fig. 2
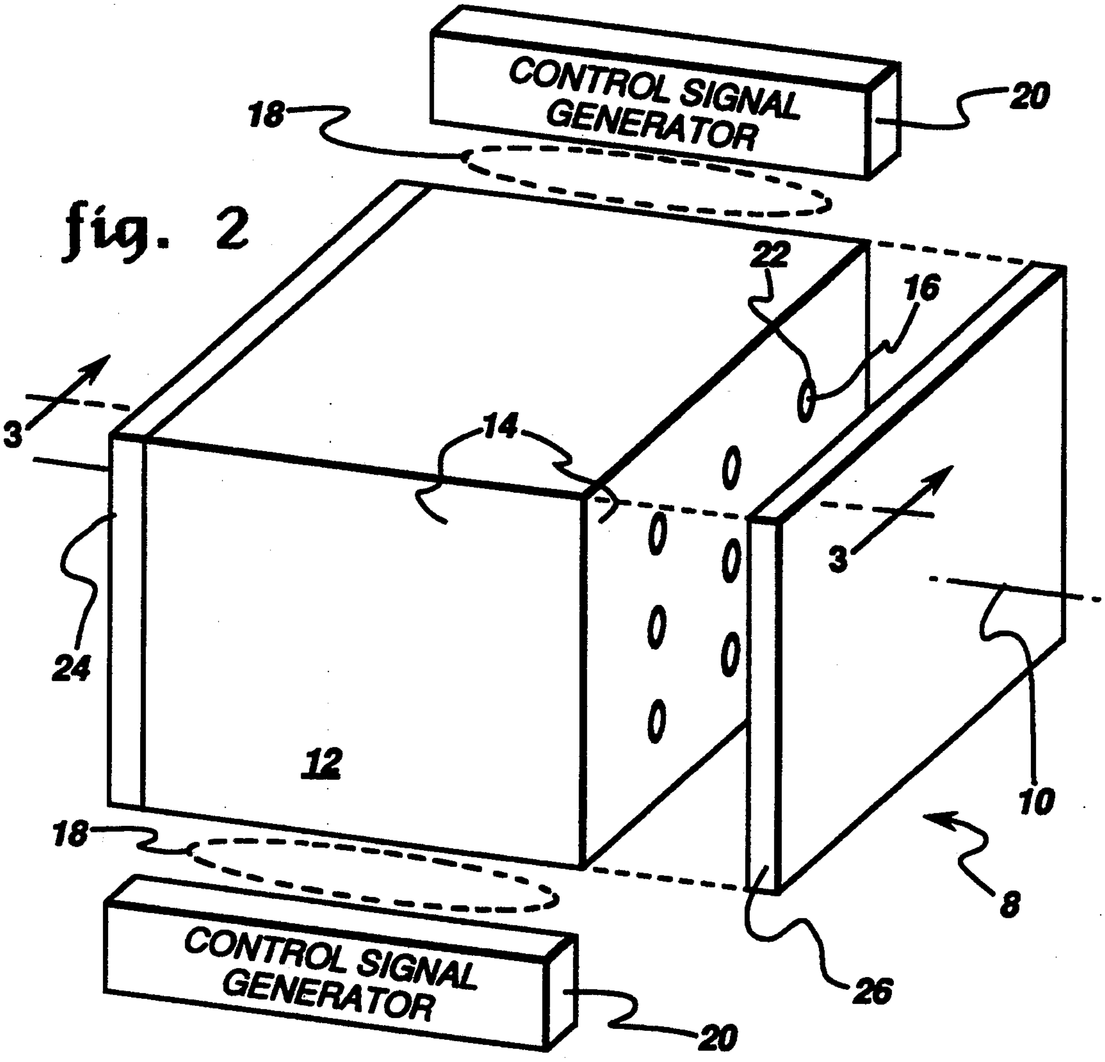
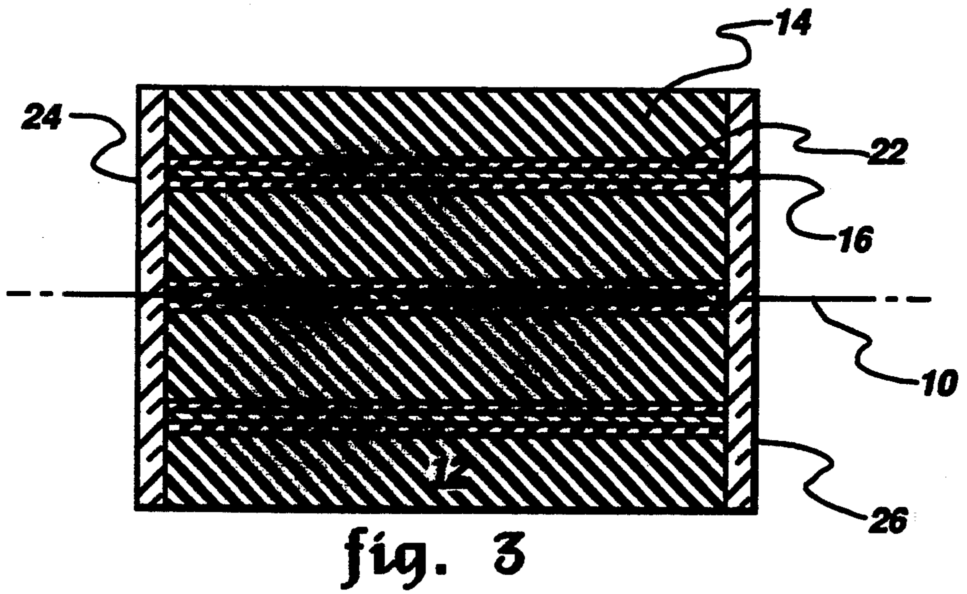
fig. 3

ULTRASONIC TRANSDUCER WITH SELECTABLE CENTER FREQUENCY

BACKGROUND OF THE INVENTION

This invention relates to ultrasonic transducers and, more particularly, to an ultrasonic transducer with a center frequency that can be dynamically selected in response to a suitable control signal applied to the transducer.

Ultrasonic transducers for medical or industrial applications are generally constructed from one or more piezoelectric elements sandwiched between a pair of electrodes. Such piezoelectric elements are typically constructed of lead zirconate titanate (PZT), polyvinylidene difluoride (PVDF), or PZT ceramic/polymer composite. The electrodes are connected to a voltage source, and when a voltage is applied, the piezoelectric elements are excited at a frequency corresponding to that of the applied voltage. When a voltage pulse is applied, the piezoelectric element emits an ultrasonic beam into the media to which it is coupled at the frequencies contained in the excitation pulse. Conversely, when an ultrasonic beam strikes the piezoelectric element, the element produces a corresponding voltage across its electrodes. Typically, the front of the element is covered with an acoustic beam matching layer that improves the coupling with the media in which the ultrasonic beams propagate. In addition, a backing material is disposed to the rear of the piezoelectric element to absorb ultrasonic beams that emerge from the back side of the element so that they do not interfere. A number of such ultrasonic transducer constructions are disclosed in U.S. Pat. Nos. 4,217,684, 4,425,525, 4,441,503 and 4,470,305, all of which are assigned to the instant assignee.

Typically the transducer can be designed based upon its constituent piezoelectric material and specific construction to operate at a generally fixed predetermined center frequency depending on the particular industrial or medical application chosen for a given transducer. For example, in a given medium, to provide increased depth of penetration for the ultrasonic beam transmitted by the transducer usually requires a corresponding increase to the center frequency. Typical transducers in general provide a frequency response which is relatively confined to near the operating center frequency of the transducer. It is desirable to provide center frequency selectivity in order to, for example, utilize a given individual ultrasonic transducer in a broader array of applications than would be possible if the transducer was designed to operate at a generally fixed center frequency. Although such center frequency selectivity is desirable, operation of an ultrasonic transducer at different center frequencies can be difficult being that certain acoustical properties, such as the modulus of elasticity, of the constituent piezoelectric material of the transducer, which in turn determine the center frequency, are essentially fixed for a given piezoelectric material. In general, schemes proposed heretofore have failed to provide a workable scheme for substantially changing such piezoelectric modulus in a controllable manner. Thus, there is a need in the art to provide an improved ultrasonic transducer which is capable of dynamically and selectably changing its center frequency in a manner that advantageously allows such transducer to expand its range of operation and thus results in a transducer with broad versatility of use in medical and/or industrial applications.

SUMMARY OF THE INVENTION

Generally speaking, the present invention fulfills the foregoing needs by providing an ultrasonic transducer which, for example, can be conveniently used in an imaging system. The ultrasonic transducer comprises a transducer element which generates a beam of ultrasound energy propagating along a transducer axis. The transducer element is made of a composite including a piezoelectric base and a plurality of elongated rods extending in the piezoelectric base substantially parallel to the transducer axis. The plurality of rods is made of a material substantially responsive to a predetermined control signal applied thereto and such plurality of rods cooperates in response to the control signal to selectively shift a center frequency of the ultrasonic beam produced by the transducer.

The transducer typically includes means for generating the applied control signal, thereby selectively controlling the center frequency of the ultrasonic beam. In one embodiment, the rod material is made of a magnetostrictive material such as Teffenol or Metglass 2605SC alloys and the generating means is a coil which generates a magnetic control signal and which is magnetically coupled to the plurality of rods. By way of example, in this one embodiment the center frequency can be selectively shifted, based upon the level of the magnetic control signal, in an operating range having respective upper and lower bounds separated from each other by a factor of about three to one. In another embodiment the rod material is made of a suitable shape memory alloy, such as Nitinol (NiTi) shape memory alloy or the like, and the generating means is a heater which generates a thermal signal and which is thermally coupled to the plurality of rods to provide suitable temperature control to the shape memory alloy rod material. By way of example, in this other embodiment the center frequency can be selectively shifted, based upon the temperature of the rod material, in an operating range having respective upper and lower bounds separated from each other by a factor of about at least five to one. Preferably, in each embodiment the plurality of rods is bonded in the piezoelectric base using a predetermined electrically insulating material. Thus, it should be appreciated that the present invention provides an improved ultrasonic transducer capable of dynamically selecting the center frequency of the ultrasonic beam produced therewith in a manner that facilitates versatility of use over presently available ultrasonic transducers.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

FIG. 2 shows an isometric of the ultrasonic transducer of the present invention and a block diagram representation for a suitable control signal generator operatively coupled to the transducer; and FIG. 3 is a cross sectional view taken at line 3—3 of FIG. 2.

DETAILED DESCRIPTION OF THE INVENTION

Figure 1A:
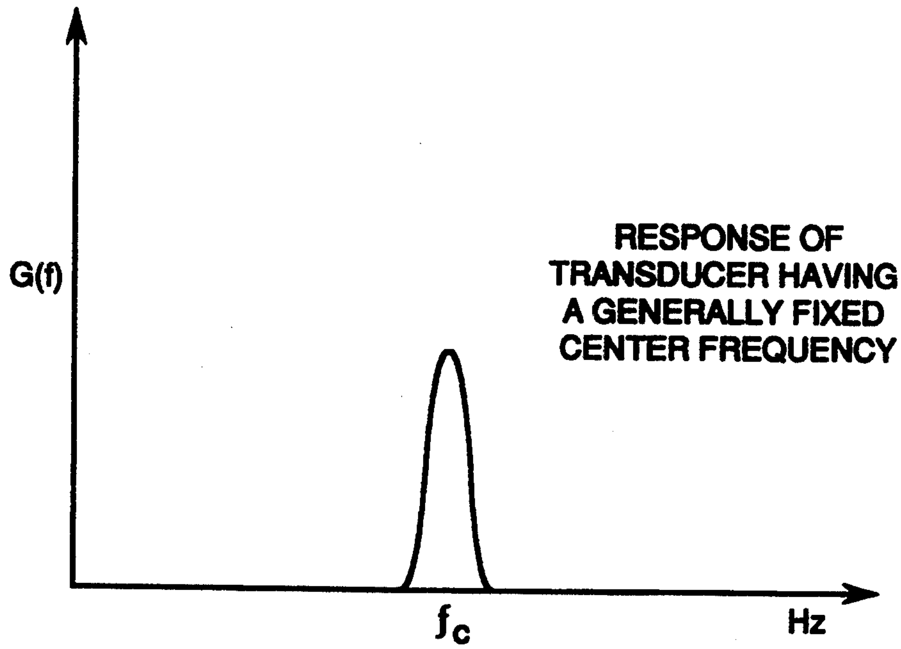
fig. 1A PRIOR ART
FIG. 1A shows an exemplary response of a prior art transducer having a generally fixed center frequency.

FIG. 1A shows an exemplary frequency response G(f) of a typical prior art ultrasonic transducer which exhibits a center frequency $f_c$ which is generally fixed, that is, once a given ultrasonic transducer has been constructed the center frequency is not generally variable since such center frequency is usually chosen in accordance with the specific medical or industrial application for the given transducer.

Figure 1B:
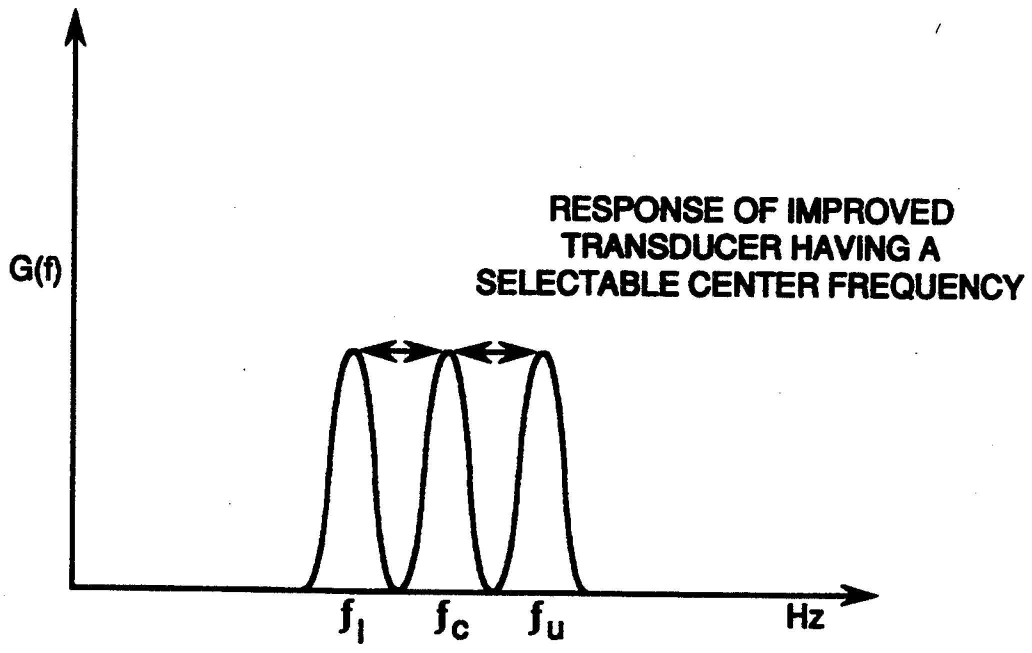
FIG. 1B shows an exemplary response of the improved ultrasonic transducer having a selectable center frequency in accordance with the present invention.

In contrast to the frequency response of the prior art transducer, FIG. 1B shows an exemplary response of the improved transducer of the present invention which exhibits a center frequency which can be selectively shifted, as represented by the twin headed arrows, over a predetermined wide frequency range having respective upper and lower bounds $f_l$ and $f_u$, respectively.

FIG. 2 shows an ultrasonic transducer 8 which can be operated to provide the exemplary response shown in FIG. 1B and which, for example, can be conveniently used for an imaging system (not shown). The transducer typically generates a beam of ultrasound energy which, for example, can propagate along a transducer axis 10. The transducer is made of a composite 12 which includes a piezoelectric base 14 made of a suitable piezoelectric material such as the piezoelectric materials generally described in the background section of the present disclosure. A plurality of elongated rods 16 made of a material substantially responsive to a predetermined control signal 18 applied to the transducer cooperates, as will be explained shortly hereafter, to selectively shift the center frequency of the ultrasonic beam produced by the transducer. As used herein, center frequency refers to the fundamental resonant mode of vibration of the ultrasonic transducer. The rod material is chosen such that certain acoustical properties of the composite that determine the value for the center frequency (such as the speed of propagation of sound in the composite) can be selectively controlled in response to the applied control signal, thereby selectively controlling the value for the center frequency of the ultrasonic beam.

As will be appreciated by those skilled in the art, the phenomenon of magnetostriction, that is, the change in shape and size of a body whenever its state of magnetization is changed, has been observed in numerous materials. In particular, due to magnetostriction the elastic properties of certain alloys such as Terfenol alloy (approximate formulation $Tb_{0.3}\ Dy_{0.7}\ Fe_2$) and Metglass 2605SC alloy; and rare earth compounds such as $TbFe_2$ have demonstrated significant dependence on the level of a magnetic field applied to such materials. For instance in the case of the Terfenol alloy, the Young's Modulus of elasticity has been observed to increase by up to at least 2.5 times from an unexcited state, that is, the state corresponding to the level of the magnetic field applied to the material being zero, to a magnetic saturation state. Since the coefficient of elasticity of a given material can be shown to be directly related to the speed of propagation of sound passing therethrough, the foregoing property can be advantageously exploited to dynamically vary the speed of propagation of the beam of ultrasound energy passing therethrough by varying the level of the control signal applied to the given material, i.e., varying the level of the magnetic field which causes the material to change its coefficient of elasticity. In particular, the longitudinal velocity of sound passing through a typical bulk isotropic material is given by:

$$C_l = \sqrt{\frac{E}{\rho}} \qquad \text{Eq. (1)}$$

where $\rho$ is the density of the material and E is the coefficient of elasticity corresponding to the longitudinal direction of propagation. From Eq. 1 it can be easily shown that the center frequency fc of the ultrasonic beam is given by:

$$f_c = \frac{1}{2L}\sqrt{\frac{E}{\rho}} \qquad \text{Eq. (2)}$$

where L is the longitudinal dimension of the transducer along the transducer axis. Thus, in one embodiment for the present invention the plurality of rods can be conveniently made of a magnetostrictive material, such as the foregoing exemplary alloys, which typically responds to an applied magnetic field H as follows:

$$S=\Delta L/L=CH^2 \qquad \text{Eq.(3)}$$

where S is a percentage change in the longitudinal dimension for a given material and C is the magnetostriction coefficient for such given material. Thus, in this one embodiment transducer 8 includes generating means 20, such as a conventional coil, for generating a magnetic control signal and magnetically coupled to the plurality of rods 16. Therefore, the transducer 8 can be operable such that the speed of propagation of the sound beam passing therethrough is selectively controlled in response to the level of the magnetic field applied to the transducer by the conventional coil, designated in FIG. 2 as control signal generator 20. For example, in the Terfenol alloy, the Young's Modulus of elasticity has been observed to increase by up to at least 2.5 times from the unexcited state with a resulting speed of propagation change of at least 60% in a magnetic field of 5 kOe. Conversely, in the Metglass 2605SC alloy, the Young's Modulus of elasticity has been observed to decrease by at least 10 times from an unexcited state which can result in a speed of propagation change of up to 300% in a magnetic field of 1 Oe. By way of example and not of limitation, the embodiment which incorporates a composite having a magnetostrictive alloy as constituent material for the plurality of elongated rods 16, can provide a center frequency that can be selectively shifted in an operating range having respective lower and upper bounds $f_l$ and $f_u$ (as represented in FIG. 1B) separated from each other by a factor of about three to one. For example, if the lower bound $f_l$ is 5 Mhz then the upper bound $f_u$ would be 15 Mhz. Preferably the plurality of rods 16 is bonded in the piezoelectric base 12 using a suitable electrically insulating material 22 such as insulating epoxy or the like. In this manner, such electrically insulating material 22 avoids electrical shorts between the magnetostrictive rods and the piezoelectric base. Further, a beam backing layer 24 can be positioned rearward of the transducer to conveniently absorb ultrasound energy reflected toward the back face of the transducer. In addition, a beam matching layer 26 can be positioned forward of the output face of the lens to provide a suitable acoustical matching impedance to the beam passing therethrough. The actual value for the matching impedance being chosen depending on the specific nature of the medium upon which the beam of ultrasound energy is transmitted into.

It will be appreciated by those skilled in the art, that other materials which undergo changes in their Young's Modulus of elasticity in response to a suitable control signal can be alternatively used as the constituent material for the plurality of elongated rods 16. For example, shape memory alloys such as Cu—Zn—Al, Cu—Al—Ni and NiTi undergo a structural transition based upon respective solid-state phase changes such as those occurring from a martensitic phase to an austenitic phase when the temperature of the shape memory alloy is above a predetermined critical temperature. The structural transition is accompanied by changes to the elastic modulus of the shape memory alloy and thus in another embodiment of the present invention the plurality of rods in the piezoelectric base can be suitably made of a respective shape memory alloy material. In this other embodiment, generating means 20 is simply a heater which generates a predetermined thermal control signal, that is, the heater is operated and thermally coupled to the plurality of rods 16 to provide a suitable temperature control which in turn provides a controllable change to the respective elastic moduli of the plurality of rods 16.

As explained in the context of the one embodiment with magnetostrictive rods, the elastic moduli change in the plurality of rods in the piezoelectric base can be used to selectively change the center frequency for the ultrasonic beam produced by the transducer. Thus, in this other embodiment which incorporates a plurality of rods 16 made of a suitable shape memory alloy, the location for the center frequency can be conveniently shifted by varying and controlling the temperature of the shape memory alloy material. By way of example, the Young's modulus of the shape memory alloy NiTi changes by approximately 3 to 4 times from its martensitic to its austenitic phase, other shape memory alloys can experience even larger changes (up to about 25 times) in their respective Young's Modulus of elasticity. For instance, a transducer which incorporates a composite having a shape memory alloy as constituent material for the plurality of elongated rods 16, can provide a center frequency that can be selectively shifted in an operating range having respective lower and upper bounds $f_l$ and $f_u$ (as represented in FIG. 1B) separated from each other by a factor of about at least five to one. For example, if the lower bound $f_l$ is 5 Mhz then the upper bound $f_u$ would be 25 Mhz. Here again, the plurality of rods is preferably bonded in the piezoelectric base 12 using a suitably electrically insulating material to avoid electrical shorts between the shape memory alloy rods and the piezoelectric base. From the foregoing, it should be appreciated that an improved ultrasonic transducer with a selectable center frequency can now be accomplished in accordance with the present disclosure which advantageously increases the array of applications for such improved ultrasonic transducer.

It will be understood that the features of the invention shown and described herein are exemplary only. Numerous variations, changes, substitutions and equivalents will now occur to those skilled in the art without departing from the spirit and scope of the present invention. For example, U.S. patent application Ser. No. 08/162,988 of Peter W. Lorraine entitled "ULTRASONIC TRANSDUCER WITH MAGNETOSTRICTIVE LENS FOR DYNAMICALLY FOCUSSING AND STEERING A BEAM OF ULTRASOUND ENERGY", assigned to the assignee of the present invention, describes an acoustical lens for dynamically focussing and steering a beam of ultrasound energy. Thus, the ultrasonic transducer of the present invention could be conveniently coupled with the acoustical lens described in the foregoing patent application to provide dynamic focussing and steering as well as center frequency selectivity to the ultrasonic beam produced by such combination. Accordingly, it is intended that all subject matter described herein and shown in the illustrative drawings be regarded as illustrative only and not in a limiting sense and that the scope of the invention claimed be determined solely by the appended claims.

What is claimed:

1. An ultrasonic transducer comprising:

a transducer element which generates a beam of ultrasound energy propagating substantially along a transducer axis;

said transducer element made of a composite including a piezoelectric base and a plurality of elongated rods extending in said base substantially parallel to said transducer axis, said plurality of rods made of a material selected from the group consisting of magnetostrictive and shape memory alloys substantially responsive to a predetermined control signal applied thereto and cooperating in response to said control signal to selectively shift a center frequency of said beam of ultrasound energy.

2. The ultrasonic transducer of claim 1 further comprising means for generating said control signal applied to said transducer element.

3. The ultrasonic transducer of claim 2 wherein the rod material comprises a magnetostrictive alloy and said means for generating comprises a coil magnetically coupled to said plurality of rods.

4. The ultrasonic transducer of claim 3 wherein said center frequency can be selectively shifted in an operating range having respective lower and upper bounds separated from each other by a factor of about three to one.

5. The ultrasonic transducer of claim 2 wherein the rod material comprises a shape memory alloy and said means for generating comprises a heater thermally coupled to said plurality of rods.

6. The ultrasonic transducer of claim 5 wherein said center frequency can be selectively shifted in an operating range having respective lower and upper bounds separated from each other by a factor of about five to one.

7. The ultrasonic transducer of claim 2 further comprising a beam matching layer positioned forward of said transducer element to pass said beam of ultrasound energy.

8. The ultrasonic transducer of claim 7 further comprising a beam backing layer positioned rearward of said transducer element.

9. The ultrasonic transducer of claim 2 wherein said plurality of rods is bonded in said piezoelectric base using a predetermined electrically insulating material.

10. An ultrasonic transducer comprising:

a transducer element which generates a beam of ultrasound energy propagating substantially along a transducer axis;

said transducer element made of a composite including a piezoelectric base and a plurality of elongated rods extending in said base substantially parallel to said transducer axis, said plurality of rods made of a material selected from the group consisting of magnetostrictive and shape memory alloys substantially responsive to a predetermined control signal applied thereto and cooperating in response to said control signal to selectively shift a center frequency of said beam of ultrasound energy; and a signal generator to generate said control signal applied to said transducer element.

11. The ultrasonic transducer of claim 10 wherein the rod material comprises a magnetostrictive alloy and said signal generator comprises a coil magnetically coupled to said plurality of rods.

12. The ultrasonic transducer of claim 11 wherein said center frequency can be selectively shifted in an operating range having respective lower and upper bounds separated from each other by a factor of about three to one.

13. The ultrasonic transducer of claim 10 wherein the rod material comprises a shape memory alloy and said signal generator comprises a heater thermally coupled to said plurality of rods.

14. The ultrasonic transducer of claim 13 wherein said center frequency can be selectively shifted in an operating range having respective lower and upper bounds separated from each other by a factor of about five to one.

15. The ultrasonic transducer of claim 14 further comprising a beam matching layer positioned forward of said transducer element to pass said beam of ultrasound energy.

16. The ultrasonic transducer of claim 15 further comprising a beam backing layer positioned rearward of said transducer element.

17. The ultrasonic transducer of claim 10 wherein said plurality of rods is bonded in said piezoelectric base using a predetermined electrically insulating material.

* * * * *